United States Patent [19]
Li

[11] Patent Number: 5,970,110
[45] Date of Patent: Oct. 19, 1999

[54] PRECISE, LOW-JITTER FRACTIONAL DIVIDER USING COUNTER OF ROTATING CLOCK PHASES

[75] Inventor: Hung-Sung Li, Santa Clara, Calif.

[73] Assignee: NeoMagic Corp., Santa Clara, Calif.

[21] Appl. No.: 09/004,933

[22] Filed: Jan. 9, 1998

[51] Int. Cl.$^6$ ................................................ H03K 21/00
[52] U.S. Cl. ........................... 377/48; 327/115; 327/147;
327/149; 327/150; 327/151; 327/232; 327/236;
327/241; 327/243
[58] Field of Search .............................. 377/48; 327/115,
327/147, 149, 150–1, 156, 158–60, 232,
236, 241, 243

[56] References Cited

U.S. PATENT DOCUMENTS

| | | | |
|---|---|---|---|
| 4,241,408 | 12/1980 | Gross | 364/703 |
| 4,494,243 | 1/1985 | Elmis | 377/48 |
| 4,837,721 | 6/1989 | Carmichael et al. | 364/703 |
| 4,975,931 | 12/1990 | Cosand | 377/52 |
| 5,088,057 | 2/1992 | Amrany et al. | 364/703 |
| 5,224,132 | 6/1993 | Goldberg | 377/48 |
| 5,235,531 | 8/1993 | Foerg | 364/703 |
| 5,287,296 | 2/1994 | Bays et al. | 364/703 |
| 5,473,553 | 12/1995 | Thierry | 364/703 |
| 5,521,556 | 5/1996 | O'Shaughnessy et al. | 331/1 R |
| 5,889,436 | 3/1999 | Yeung et al. | 331/2 |

OTHER PUBLICATIONS

Johnson & Hudson, "A Variable Delay Line PLL for CPU–Coprocessor Synchronization" IEEE JSSC vol. 23, No. 5, (Oct. 1988),pp. 1218–1223.

*Primary Examiner*—Margaret R. Wambach
*Attorney, Agent, or Firm*—Stuart T. Auvinen

[57] ABSTRACT

A fractional divider divides an input by a non-whole number M.N, where M is the integer part and N is the fractional part of the divisor. A delay line generates a group of multi-phase clocks from an input clock. A mux selects one of the multi-phase clocks as a selected clock. The selected clock increments a counter that counts to the integer part M. The selected clock also increments a rotational state machine. The rotational state machine makes the mux select a different one of the multi-phase clocks for the first N clocks so that the phase of the selected clock is rotated for N cycles. When multi-phase clocks having slightly higher delays are chosen, the selected clock's period increases, adding a fraction. When multi-phase clocks having slightly smaller delays are chosen, the selected clock's period is reduced, effectively subtracting a fraction. The delay line is part of a delay-locked loop that compares the phase of the last multi-phase clock to the input clock. Any phase difference charges a loop filter and changes an adjustment voltage. The adjustment voltage changes the delays in the delay line so that the sum of all delays in the delay line matches the clock period. Since smaller count values can be used when fractional rather than whole-number divisors are used, phase comparisons in a PLL are increased, reducing jitter and smoothing the output.

19 Claims, 7 Drawing Sheets

COMPARE
EVERY
FIN/X OR
FOUT/Y

COMPARE
EVERY
FIN OR
FOUT/M.N

PRECISE, LOW-JITTER FRACTIONAL DIVIDER USING COUNTER OF ROTATING CLOCK PHASES

FIELD OF THE INVENTION

This invention relates to digital dividers, and more particularly to fractional dividers having non-whole-number divisors.

BACKGROUND OF THE INVENTION

Digital dividers are a common building block in many different kinds of electronic systems. Frequency generators often use dividers to reduce an input frequency to a desired frequency. Phase-locked loops (PLL's) use a divider in the feedback path to multiply the clock frequency. PLL's with a divider on the input as well as a feedback-path divider can be used to generate arbitrary-frequency clocks. The output frequency is the ratio of the terminal counts for the two dividers.

Digital dividers are commonly implemented as counters that output a pulse after a predetermined number of input clock pulses have been received. These simple dividers count a whole number (M) of pulses. Additional logic may be used to reset the counter after half of a clock pulse once the terminal count M has been reached, thus achieving division by M.5, a simple fractional, non-whole number.

Such dividers are not able to divide by an arbitrary fraction, such as M.N, where M is the integer part and N is the fractional part of a real number. Arbitrary fractional divisors such as 5.3, 8.2, and 3.7 are difficult to implement.

Other dividers switch between a count of M and a count of M+1. Over a long time, the average frequency is determined by the ratio of the time the count is M or M+1. However, jitter is introduced since the instantaneous frequency is determined by either M or M+1.

Logic circuits have been used to divide by a fraction rather than a whole number. See for example U.S. Pat. No. 5,287,296 by Bays et al., and assigned to AT&T. Simple logic circuits often produce uneven clock periods which are undesirable. More complex logic circuits such as adders/accumulators have been used for fractional dividers. See for example, U.S. Pat. Nos. 4,494,243, 4,241,408, 5,088,057, and 5,235,531. These complex adders are expensive in die area and can increase latency or limit the frequency of the generated clock. Overflow may be a problem with complex adders.

Dividers are often used in PLL's. More recently, PLL's that slowly change the frequency over time are being used to reduce electromagnetic interference (EMI). See for example, "EMI Reduction for a Flat-Panel Display Controller Using Horizontal-Line-Based Spread Spectrum", U.S. Pat. No. 5,757,338, U.S. Ser. No. 08/701,814, also assigned to NeoMagic Corp. of Santa Clara, Calif. It is desired to improve the stability of such modulated PLL's and improve the smoothness of the generated clock.

What is desired is a fractional divider with a low-jitter output. Precise division is desirable using relatively simple circuits. Small counter divisors rather than large divisors are desirable when the fractional divider is used in a PLL. Smooth frequency transitions over time, such as for clock modulation, is desirable.

SUMMARY OF THE INVENTION

A fractional divider has an input clock with an input period and a delay line that is coupled to the input clock. The delay line has a plurality of output taps. Successive output taps have successively larger phase shifts of the input clock.

A phase mux is coupled to the plurality of output taps of the delay line. It outputs a selected clock in response to a control input.

A rotational state machine has a plurality of states in a loop order. It is coupled to increment state to a next adjacent state in the loop order in response to the selected clock. The rotational state machine is coupled to output a current state as the control input to the phase mux. Successive states in the loop order select successive output taps with successively larger phase shifts.

A counter is coupled to the selected clock. It pulses an output clock after M pulses of the selected clock. The rotational state machine increments to a next state, causing the phase mux to select an output tap with a larger phase shift, increasing a period of the selected clock for a first N periods of the selected clock.

The first N periods of the selected clock have an increased period while a remaining M–N periods have the input period of the input clock. Thus the output clock is pulsed after M.N periods of the input clock.

In further aspects M.N is a decimal number and the plurality of output taps comprise ten taps. Each successive output tap has a phase shift larger than a previous tap by one-tenth of the period of the input clock.

In still further aspects of the invention the delay line is a delay-locked loop (DLL). The DLL has a loop filter that generates an adjustment voltage. A phase comparator receives the input clock and a feedback clock from a last output tap of the delay line.

The phase comparator includes a means to charge and discharge the loop filter in response to a phase difference between the input clock and the feedback clock.

A delay adjust means in the delay line increases or decreases the phase shift between successive output taps in response to the adjustment voltage. The phase difference between output taps in the delay line is adjusted by phase comparison of the feedback clock with the input clock.

In further aspects a reverse means is coupled to the rotational state machine. It reverses a direction of successive states in response to the selected clock. The rotational state machine decrements states in a reverse loop order when M is less than N.

Successive states in the reverse loop order select successive output taps having successively smaller phase shifts. The rotational state machine decrements to a next state, causing the phase mux to select an output tap has a smaller phase shift, decreasing a period of the selected clock for a first 10–N periods of the selected clock. Thus fractional clock periods are subtracted when M is less than N.

In other aspects the counter pulses the output clock after M+1 pulses of the selected clock when M is less than N. A clock doubler doubles a frequency of the input clock applied to the delay line when the M is less than four. M and N are doubled when applied to the rotational state machine and the counter when the compare means determines that M is less than four. Thus the input clock, M, and N are doubled when M is less than four.

In other aspects a voltage-controlled oscillator (VCO) is coupled to the control voltage from the phase comparator. The VCO generates an output clock having an output frequency determined by the control voltage. A fractional divider receives the output clock and generates the feedback clock. The fractional divider generates the feedback clock with a frequency equal to the output frequency divided by M.N, where M is an integer part and N is a fractional part of a non-whole number. Thus the output frequency is equal to the input frequency multiplied by M.N. The VCO generates the plurality of multi-phase clocks.

DETAILED DESCRIPTION

The present invention relates to an improvement in fractional dividers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a fractional counter can be implemented by extending clock pulses of an integer counter. A fractional counter divides by M.N, where M is the integer or whole number part and N is the fractional or decimal part. For example, a 90 MHz clock is to be divided by 5.3 to generate a 16.98113207547 MHz clock. M is 5 and N is 3. A divide by M (5) counter can be used to count up to 5.0, and an extra 0.3 clock periods can be added to generate a period of 5.3 input clocks for each output clock.

Figure 1:
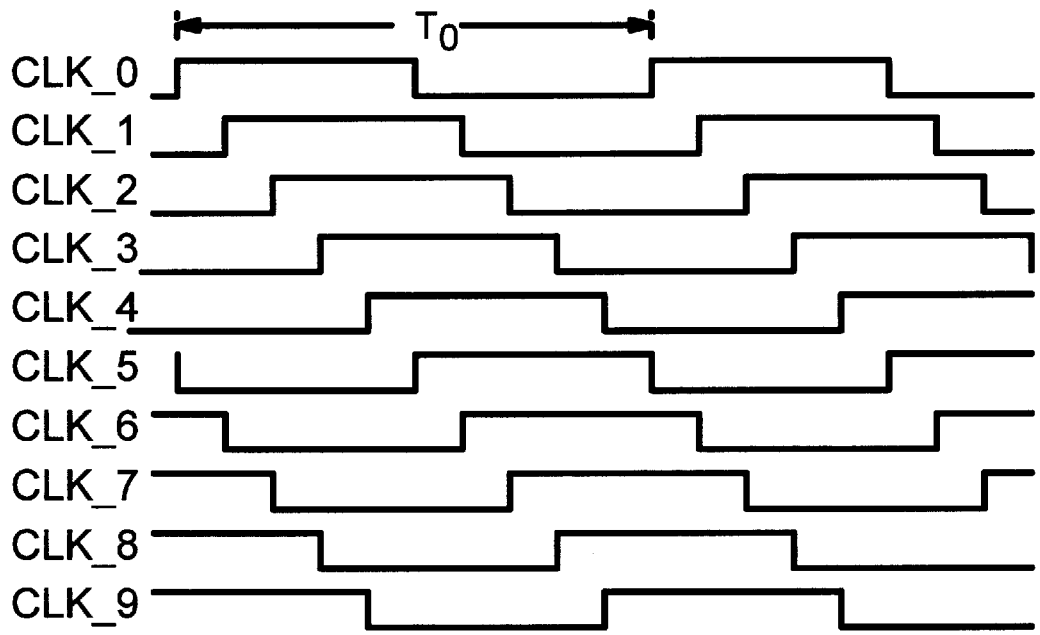
FIG. 1 shows ten multi-phase clocks having phase shifts of one-tenth of the clock period.
Figure 7:
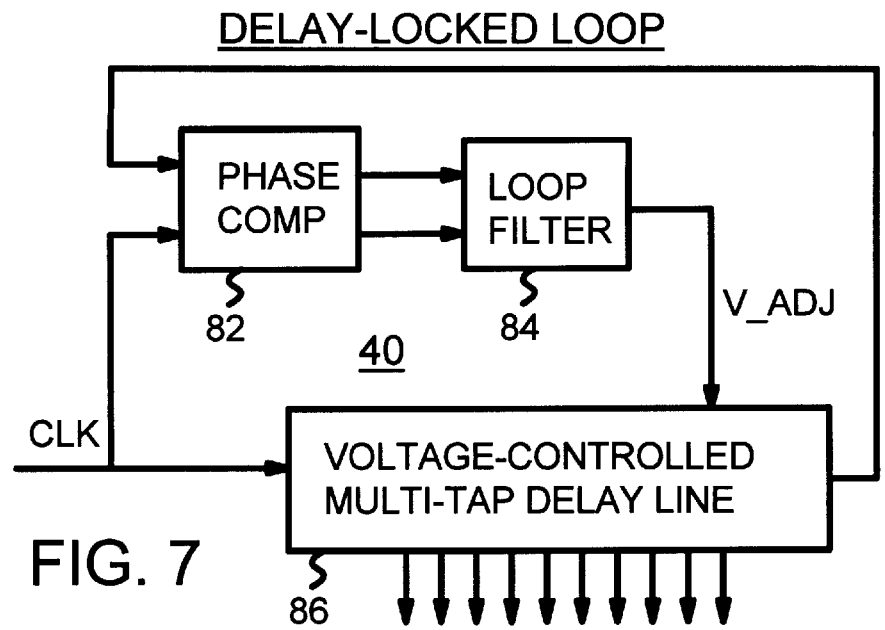
FIG. 7 is a diagram of a delay-locked loop (DLL).

The inventor has also realized that multi-phase clocks can be used to extend clock periods for a fractional divider. FIG. 1 shows ten multi-phase clocks having phase shifts of one-tenth of the clock period. Each of the ten multi-phase clocks has a period of To. However, each of the ten clocks has a different phase. The phases differ by one-tenth of the clock period To. Thus clock CLK_3 lags CLK_2 by 0.1*To, but is advanced relative to CLK_7 by 0.4*To. CLK_0 lags CLK_9 by 0.1*To. A delay-locked loop, shown later in FIG. 7, is used to generate the ten multi-phase clocks, having equal phase differences, regardless of the clock period of the input clock.

Figure 2:
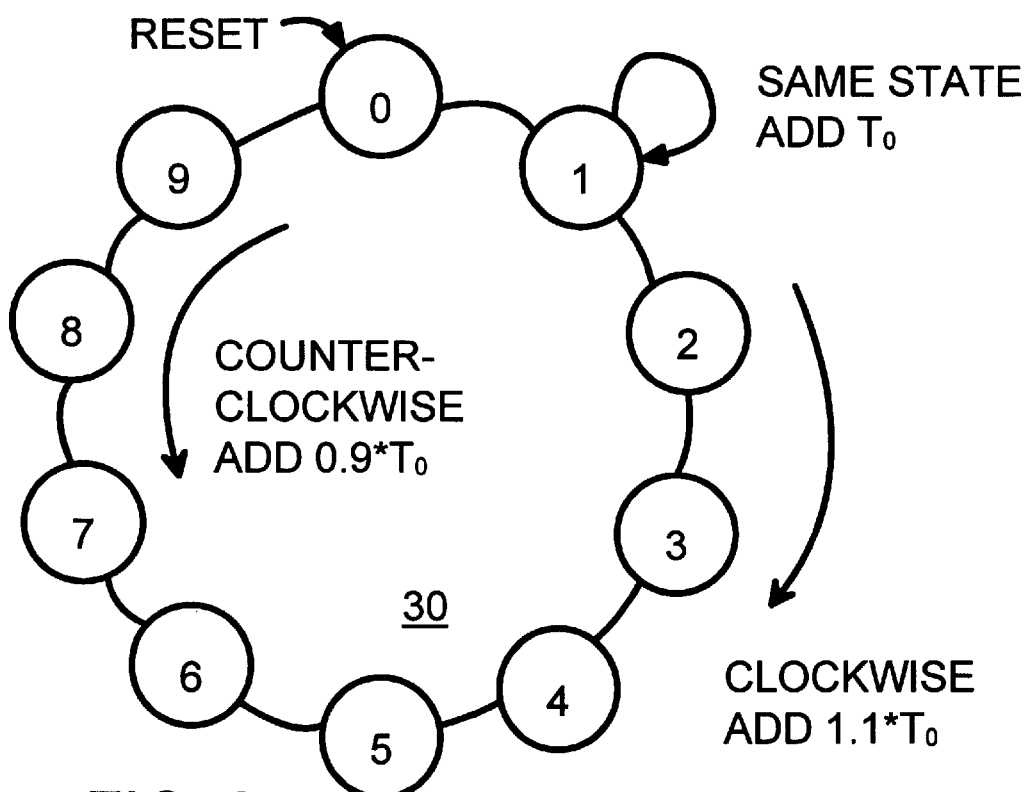
FIG. 2 is a rotational-phase state machine that selects one of the ten multi-phase clocks.

FIG. 2 is a rotational-phase state machine that selects one of the ten multi-phase clocks. State machine 30 has ten states labeled 0 to 9. During state 3, multi-phase clock CLK_3 is output to a divide-by-M counter, while in state 1, clock CLK_1 is output. Thus the state of state machine 30 determines which of the ten multi-phase clocks of FIG. 1 is selected. The selected clock advances the integer divide-by-M counter (56 of FIG. 5).

Upon reset, state 0 and clock CLK_0 are selected. States can transition in either a clockwise direction or a counter-clockwise direction to an adjacent state. Thus state 0 can transition clockwise to state 1, or counter-clockwise to state 9. State 0 may not directly transition to states 2–8 since they are not adjacent to state 0.

When the state does not change in a clock cycle, the selected clock's period remains constant at To, the period of the input clock. However, when the state changes, a different one of the multi-phase clocks selected, and the clock period is increased or reduced by 0.1*To. When the state changes in a clockwise direction, the period increases by a tenth of a period to 1.1*To. When the state changes in a counter-clockwise direction, the period is reduced by one-tenth of a period, to 0.9*To. Each successive state change increases or decreases the clock period by an additional tenth of a period.

Figure 3:
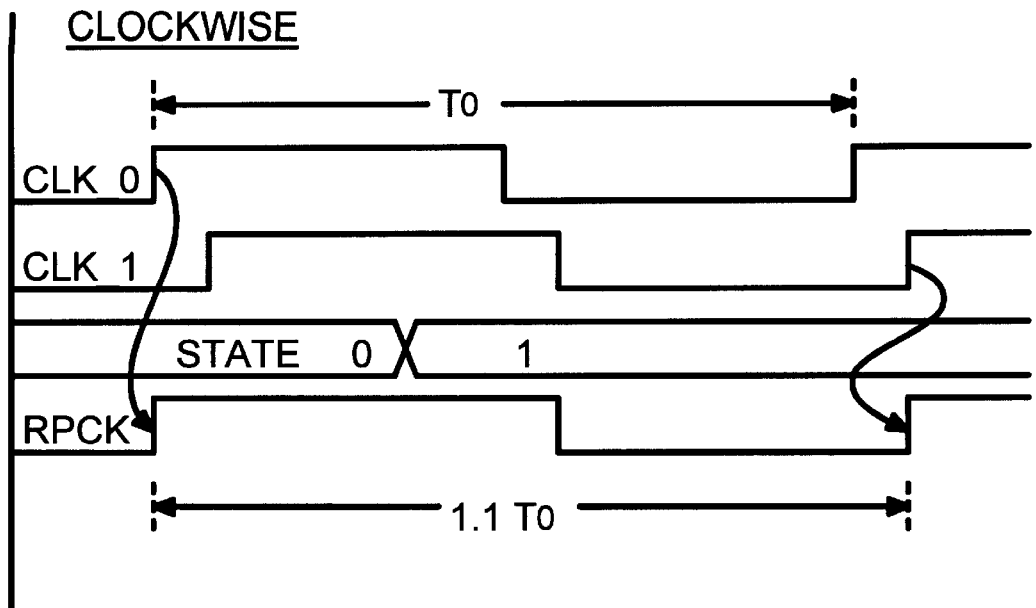
FIG. 3 highlights how the selected-clock period increases by one-tenth when the state changes in a clockwise direction.

FIG. 3 highlights how the selected-clock period increases by one-tenth when the state changes in a clockwise direction. The state machine transitions from state 0 to state 1 during a clock period. At the beginning of the clock period, clock CLK_0 is selected as the selected rotational-phase clock (RPCK). During this period, the state changes from state 0 to state 1. The selected clock therefore changes from CLK_0 to CLK_1. The start of the RPCK clock period is determined by CLK_0, but the end of the RPCK clock period is determined by CLK_1. Since CLK_1 lags CLK_0 by 0.1*To, the clock period of RPCK is increased by one-tenth of a nominal period to 1.1*To.

Figure 4:
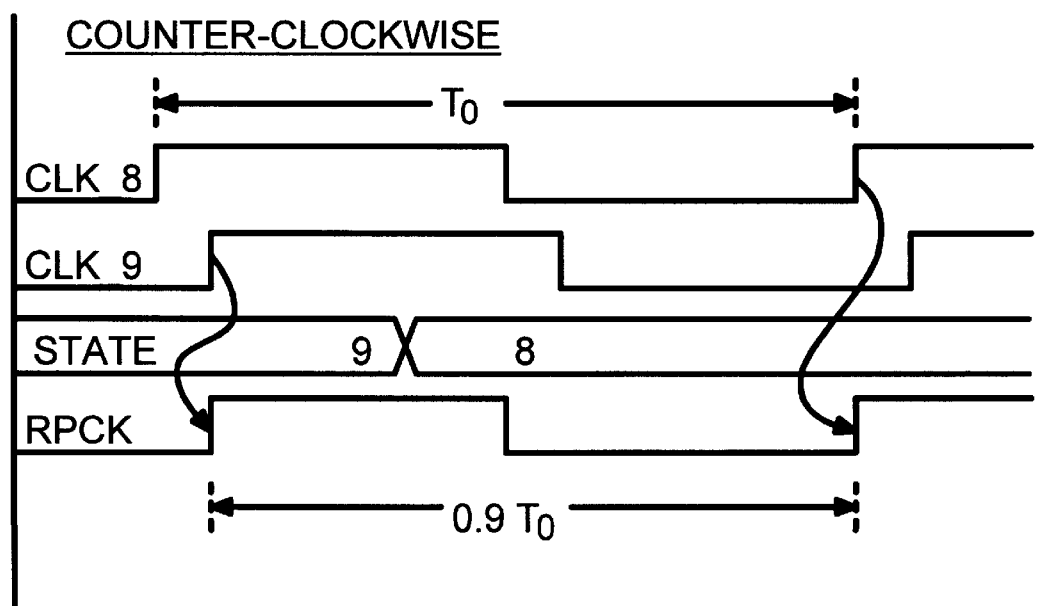
FIG. 4 shows the selected-clock period decreasing by one-tenth when the state changes in a counter-clockwise direction.

FIG. 4 shows the selected-clock period decreasing by one-tenth when the state changes in a counter-clockwise direction. The state machine transitions from state 9 to state 8 during a clock period. At the beginning of the clock period, clock CLK_9 is selected as the selected rotational-phase clock (RPCK). During this period, the state changes from state 9 to state 8. The selected clock therefore changes from CLK_9 to CLK_8. The start of the RPCK clock period is determined by CLK_9, but the end of the RPCK clock period is determined by CLK_8. Since CLK_8 leads CLK_9 by 0.1*To, the clock period of RPCK is decreased by one-tenth of a nominal period to 0.9*To.

Since the ten clocks are exactly one-tenth of a clock period apart, CLK_9 leads CLK_0 by exactly one-tenth of a period. States can sequence counter-clockwise from state 0 to state 9 and then from state 9 to state 8 to reduce the clock period by one-tenth for two consecutive cycles. This reduces the overall period of the divide by M counter from M*To to (M−0.2)*To.

Figure 5:
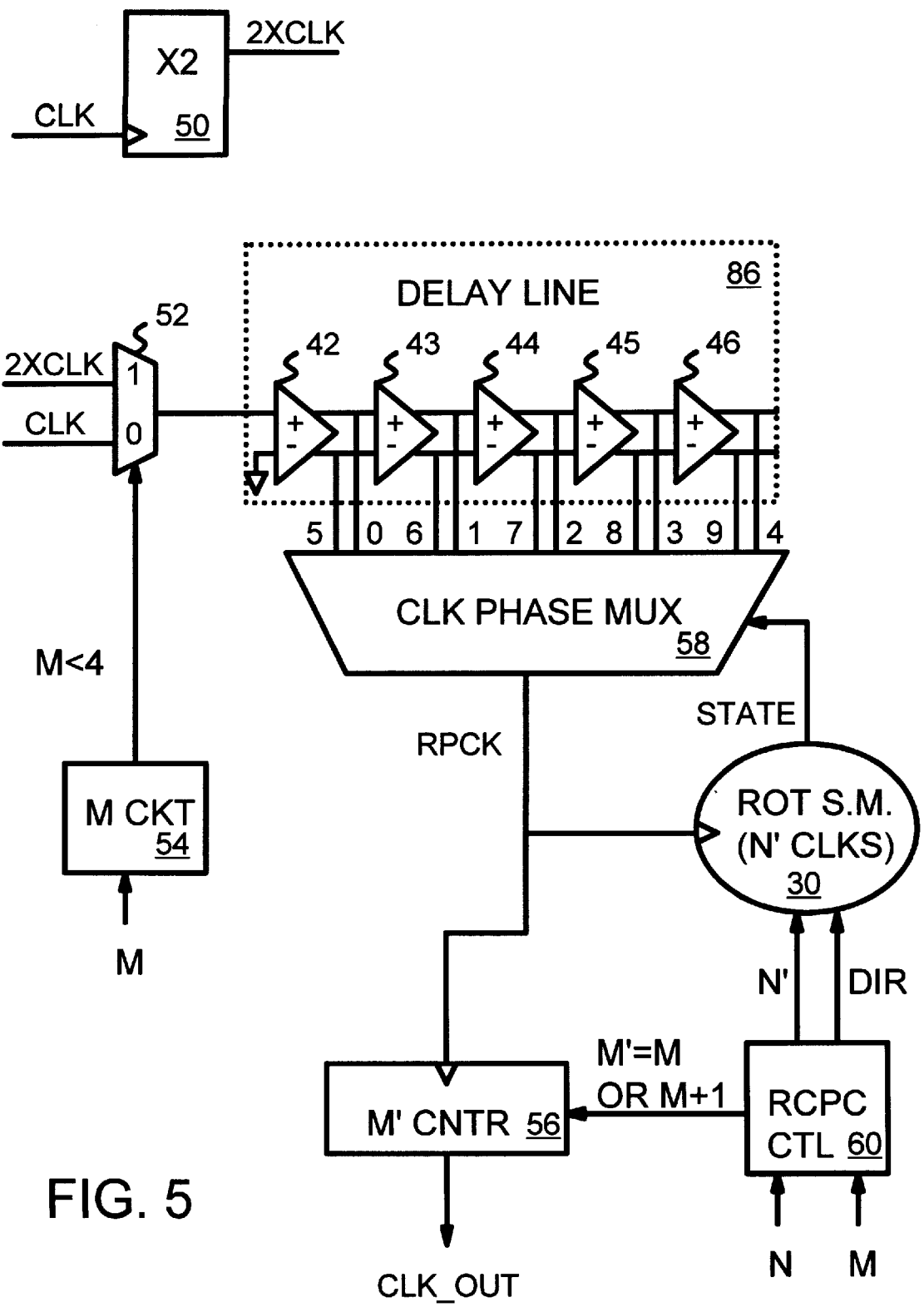
FIG. 5 is a diagram of a fractional counter that selects multi-phase clocks using a rotational-phase state machine.

Apparatus—FIG. 5

FIG. 5 is a diagram of a fractional counter that selects multi-phase clocks using a rotational-phase state machine. An input clock CLK is doubled in frequency by clock doubler 50. Mux 52 selects the doubled clock 2×CLK when the integer (M) part of the divisor M.N is less than four. Otherwise the nominal clock CLK is selected by mux 52. M circuit 54 determines when M is less than four and drives the select to mux 52. Smoothness of the output is improved by doubling the input clock for small values of M.

The clock from mux 52 is input to delay line 86. Delay line 86 has multiple output taps, using delay buffers 42, 43, 44, 45, 46. Delay line 86 can be substituted with the delay-locked loop show in FIG. 7 when the frequency of the input clock CLK is not fixed. Delay buffers 42–46 generate the ten multi-phase clocks CLK_0 to CLK_9, which are input to clock-phase mux 58.

The state from state machine 30 determines which one of the ten multi-phase clocks is selected by clock-phase mux 58 as the rotating-phase clock RPCK. State machine 30 is clocked by RPCK output from clock-phase mux 58. State machine 30 changes state in either a clockwise or in a counter-clockwise direction, depending on the DIR signal from control logic 60. State machine 30 changes states for N' cycles and then remains in the final state until restarted by integer counter 56 after M' counts.

Control logic 60 receives the integer part M and the fractional part N of divisor M.N, and generates an adjusted M and N. N' is an adjusted fraction N, while M' is an adjusted integer M. Integer counter 56 counts up from zero to the adjusted integer M', and then generates an output signal CLK_OUT. The output clock CLK_OUT has a frequency equal to the input clock CLK frequency divided by M.N.

Control logic 60 generates the direction signal DIR, and the adjusted integer and fraction M' and N' as follows:

when M>=N:
  DIR=clockwise
  M'=M
  N'=N;
when M<N:
  DIR=counter-clockwise
  M=M+1
  N'=10-N.

This adjustment ensures that the adjusted M is never less than the adjusted N, so that state machine 30 reaches N' and stops changing states before integer counter 56 reaches M'. Otherwise, the fractional part could be too large relative to the integer part, requiring too many phase adjustments.

When M is less than N, large fractions are converted to smaller, but negative fractions and the integer is increased by one. This is similar to borrowing in arithmetic circuits. The direction of state changes and phase adjustments is also reversed for large fractions. This reduces the number of state changes needed.

State machine 30 changes state and thus rotates the clock phase for N' clocks, and then remains in the last state and does not change the clock phase for the remaining M'–N' clocks. Once M' clocks are received by integer counter 56, the output clock is pulsed and integer counter 56 and state machine 30 are restarted to begin a new cycle. The overall time for one output clock is:

N*1.1*To+(M−N)*To, or
  N*0.1*To+M*To, which reduces to
  M.N*To, for M>=N.

For the counter-clockwise case of M<N, the overall time is:
  N'*0.9*To+(M'−N')*To.
This reduces to:
  (10−N)*0.9*To+(M+1−10+N)*To, or
  9*To−N*0.9*To+M*To+N*To−9*To, or
  0.1*To+M*To,
which is M.N*To.

For small integer values of M, M circuit 54 doubles the input clock. The values of M and N are then also doubled before being input to control logic 60. When M is 1, a singular case, state machine 30 can simply be rotated clockwise through one state for the only clock pulse in the case of M.N=1.1, or two counter-clockwise transitions (since M<N, M'=M+1=2). Take M.N=1.6 as an example. It can be decomposed into two 0.8's and is achieved by rotating two states counter-clockwise. A ROM may be used to decompose numbers between 1.2 and 1.9. Without a ROM, the fractional counter works for the range M.N>=2.

Figure 6:
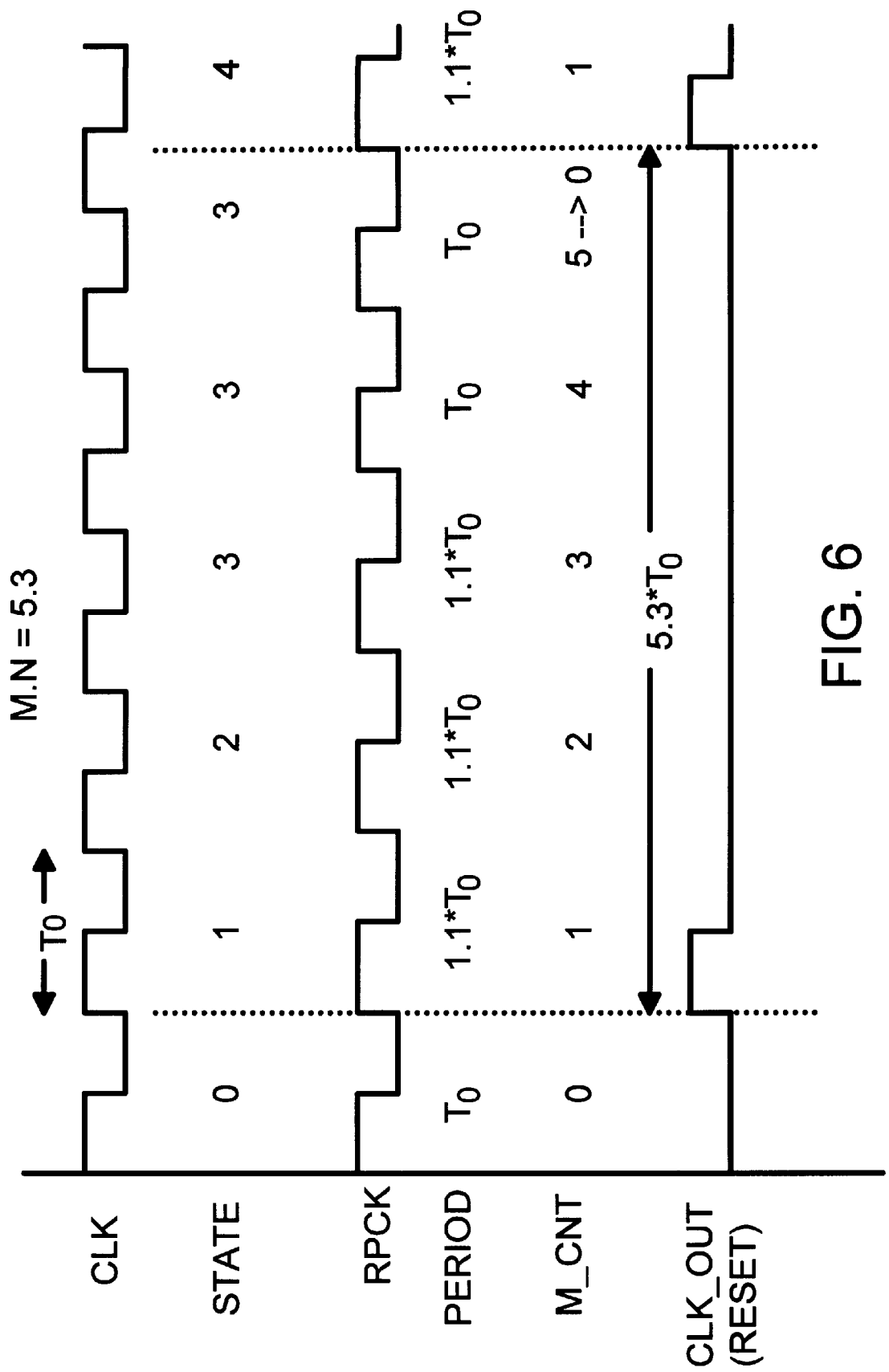
FIG. 6 is a timing diagram of the fractional counter of FIG. 5.

Timing of Fractional Counter—FIG. 6

FIG. 6 is a timing diagram of the fractional counter of FIG. 5. In the example shown in FIG. 6, the input clock CLK is divided by 5.3, so M=5 and N=3. The output CLK_OUT has a cycle or period that is 5.3 times larger than the period To of input clock CLK.

Input clock CLK is a free-running clock with equal periods for all clock cycles. The state of state machine 30 of FIG. 5 (STATE) begins in state 0 and transitions to the next state on each rising edge of clock RPCK. Since M is greater than N, control logic 60 sets the direction DIR to clockwise, and state 0 changes to state 1 and then to state 2. Finally, state 3 is reached. Since N'=N=3, state machine 30 remains in state 3 for the remaining M−N clock periods.

The rotating-phase clock RPCK output from clock-phase mux 58 is CLK_0 for the initial clock period, then CLK_1 for the next period. For the third period CLK_2 is selected, and then CLK_3. Since the state machine stops sequencing to new states after N is reached, CLK_3 remains selected as RPCK for the remaining two periods. In the last period integer counter 56 reaches M. State machine 30 is restarted from state 3. The state machine remains in state 3 and then continues in a clockwise direction to states 4, 5, 6 in the next output clock period.

The integer counter 56 counts from 0 to M'=M=5 and then resets. The output clock CLK_OUT is pulsed when M is reached. Thus the output clock has a period of 5.3*To. For the first three full periods of PRCK after reset, the period of RPCK is increased by 0.1*To, since the selected clock changes as shown for FIG. 3. For the last 2 (M−N) periods of RPCK, the selected clock does not change, and so the nominal period of To is generated.

Other values of M and N generate similar waveforms, although for N>M, the period of clock RPCK is reduced rather than extended, and the integer counter counts to M'=M+1 rather than to M. The state machine then counts to N'=10−N rather than to N.

Delay-Locked Loop—FIG. 7

FIG. 7 is a diagram of a delay-locked loop (DLL). The delay line of FIG. 5 is preferably replaced by delay-locked loop 40 of FIG. 7 when the input frequency can be changed. A standard delay line has fixed delays to each output tap. Different clock periods require that the delays change so that each successive output tap is exactly one-tenth of the clock period.

A delay-locked loop adjusts these internal delays so that the overall delay exactly matched the clock period. As the period of the input clock increases, the delays also increase. Thus the ten output taps always differ by one-tenth of the clock period, even when the clock period is changed.

A feedback loop is used to adjust the internal delays to match the clock period. This feedback loop compares the phase of the input clock to the phase of the last output from the delay line, after ten incremental delays. The ten incremental delays should exactly match the clock period, so that there is zero phase difference.

Delay line 86 produces ten outputs having equal delays between adjacent output taps. Thus delay line 86 outputs ten multi-phase clocks, each having a phase difference from the previous clock of one-tenth of the clock period.

The final output from delay line 86 has been delayed by ten incremental delays of one-tenth of the clock period. Thus the final output should have the same phase as the input clock CLK. Phase comparator 82 compares the phase of the input clock CLK to the final output from delay line 86. Any difference in phase activates a charge pump that increases or decreases the charge on a capacitor in loop filter 84. The increased charge increases the adjust voltage V_ADJ, while a decrease in charge decreases adjust voltage V_ADJ.

Loop filter 84 uses a simple capacitor filter to smooth out changes over time. This increases the stability of the feedback loop and filters out sudden changes or glitches. The capacitance value of loop filter 84 can be changed to increase or decrease response time.

The adjust voltage V_ADJ is applied to the delay elements in delay line 86. For example, when the delay elements in delay line 86 are op-amp buffers, the adjust voltage can be applied to change the bias current of each op-amp buffer. The delay time is reduced when current is increased, and vice-versa. The adjust voltage could also be used to reduce the power-supply voltage Vcc to each delay element, or to control the gate voltage of MOS transistors that act as variable resistor loading. Thus delay line 86 is a voltage-controlled delay line with multiple output taps.

The feedback loop has some similarities to a Phase-locked loop (PLL), and thus it is referred to as a delay-locked loop (DLL). See "A Variable Delay Line PLL for CPU-Coprocessor Synchronization", by Mark G. Johnson and Edwin L. Hudson in IEEE Journal of Solid-State Circuits, Vol. 23, No. 5, (1988).

The overall delay through delay line 86 is controlled by the feedback loop. Phase comparison of the input and feedback signals controls the delay. Phase comparator 82 acts to adjust the delay to match the clock period; thus the delay is "locked" by the DLL. A PLL locks the phase and frequency, rather than the delay of a delay line.

Figure 8:
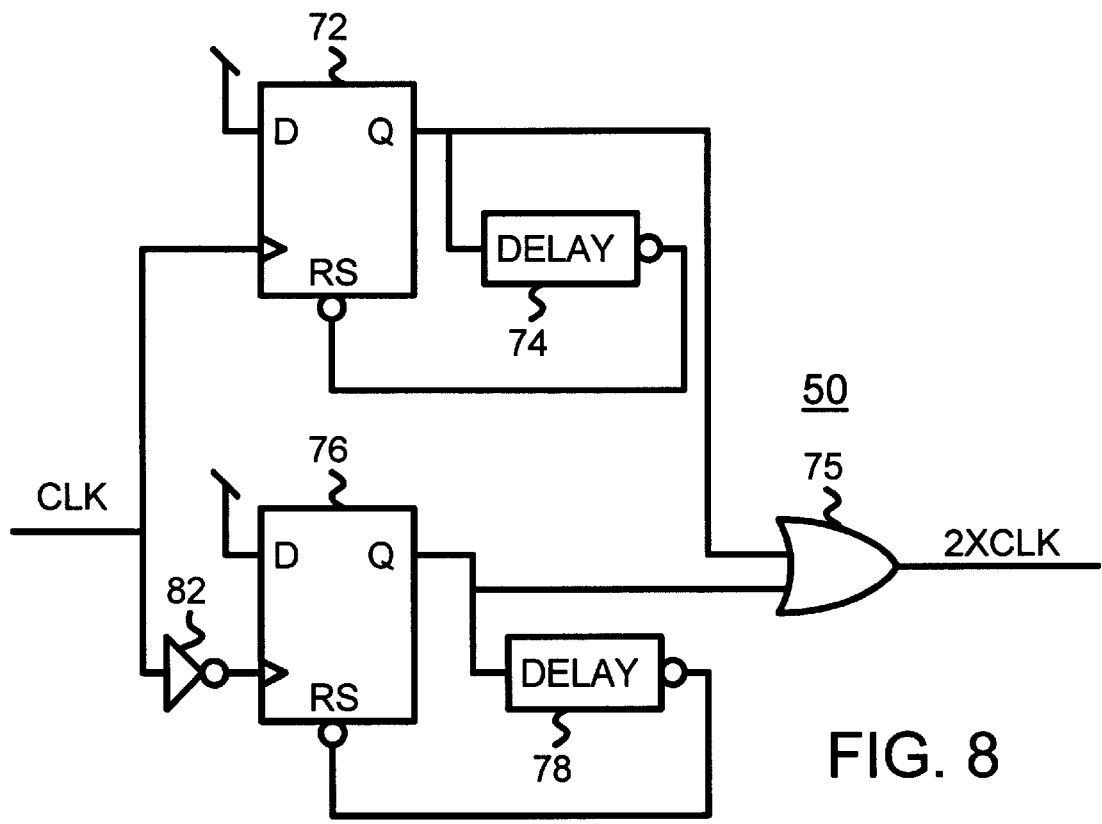
FIG. 8 is a diagram of a clock doubler.

Clock Doubler—FIG. 8

FIG. 8 is a diagram of a clock doubler. Many other embodiments for clock doublers can be substituted. Clock doubler 50 is a simple embodiment using asynchronous clears.

The input clock CLK is applied to flip-flop 72 and through inverter 82 to flip-flop 76. The rising edge of CLK clocks flip-flop 72, which drives its Q output high since its D input is connected to Vcc. This high output is applied to OR gate 75 and drives the doubled-clock 2×CLK high.

After a delay through delay line 74, a clear is applied to flip-flop 72, driving its Q output low again. OR gate 75 then drives 2×CLK low.

The falling edge of CLK clocks flip-flop 76, which drives its Q output high since its D input is also connected to Vcc. This high output is applied to OR gate 75 and drives the doubled-clock 2×CLK high for a second time. After a delay through delay line 74, a clear is applied to flip-flop 76, driving its Q output low again. OR gate 75 then drives 2×CLK low for the second time in one period of input clock CLK. Thus two high-going pulses of 2×CLK are generated for every pulse of input clock CLK. The clock is doubled in frequency.

Figure 9:
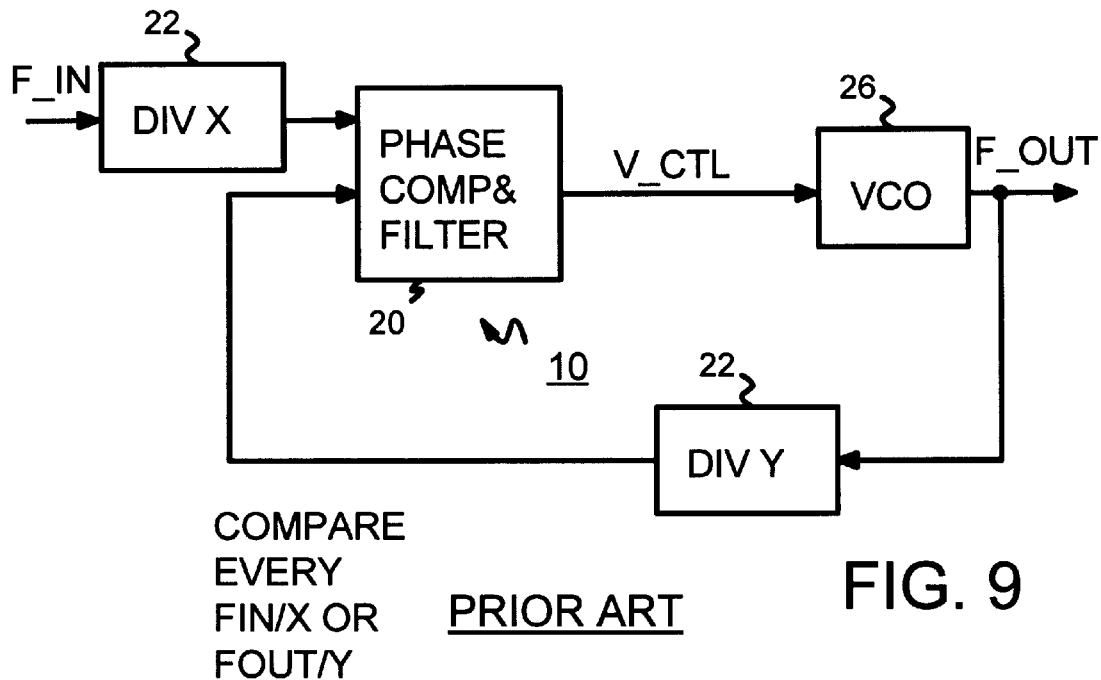
FIG. 9 is a prior-art PLL that infrequently compares the phase.

Prior-Art PLL Has Infrequent Compares—FIG. 9

FIG. 9 is a prior-art PLL that infrequently compares the phase. PLL 10 generates an output clock having an arbitrary frequency F_OUT, where F_OUT=F_IN *Y/X. A difference in phase of the inputs to comparator 20 charges or discharged a loop filter (not shown), changing the control voltage V_CTL. The control voltage is input to voltage-controlled oscillator (VCO) 26, which generates the output clock having a frequency controlled by the control voltage V_CTL.

The input clock's frequency F_IN is divided by X using input divider 22 before comparison in comparator 20. Likewise, the output frequency F_OUT is divided by Y using feedback divider 22. Comparator 20 compares the divided input clock to the divided output clock. Thus phase comparison is performed only once every F_IN/X or F_OUT/Y. The divisors X and Y are often large numbers, especially for arbitrary, non-whole-number frequencies. The phase comparisons occur at relatively lower frequencies of F_IN/X or F_OUT/Y.

The lower rate of phase comparisons reduces the response time of PLL 10, since phase changes are detected at a rate of F_IN/X, which is a much smaller frequency than F_IN. This slower response time can be a disadvantage in some applications.

Figure 10:
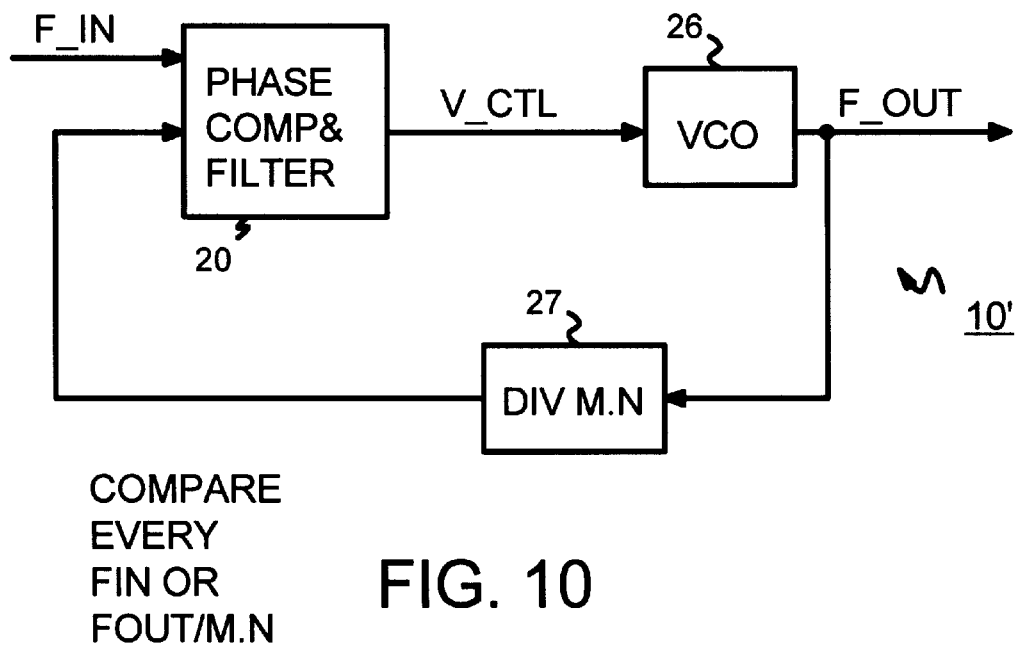
FIG. 10 is a diagram of a PLL using a fractional divider in the feedback path.

Fractional Divider PLL Has Fast Response Time—FIG. 10

FIG. 10 is a diagram of a PLL using a fractional divider in the feedback path. An input divider is not needed since fractional divider 27 is used in the feedback path. The input frequency F_IN and the output frequency F_OUT are related as F_OUT=F_IN*M.N, where M.N is the non-whole-number divisor of fractional divider 27. M is the whole-number or integer part, while N is the fractional or decimal part.

The control voltage V_CTL to VCO 26 determines the output frequency F_OUT. Phase comparator 20 receives the input frequency F_IN directly, not divided down as for the prior art of FIG. 9. Thus phase comparisons are performed at the rate of F_IN rather than F_IN/X, or at the rate of F_OUT/M.N, rather than F_OUT/Y.

PLL 10' is more responsive, and the output clock has smoother, more accurate transitions, because phase comparison is performed more frequently. The loop filter (not shown) on V_CTL can be increased to reduce responsiveness or increase smoothing and yet PLL 10' still benefits from more frequent phase comparisons, since the charge adjustments are more accurate.

As an example, assume that the output frequency F_OUT is 5.3 times input frequency F_IN. The fractional divisor M.N is 5.3. However, for the prior-art PLL of FIG. 9, X and Y must be whole numbers. The ratio Y/X must equal 5.3, so the smallest integers for X and Y are Y=53, X=10 for a ratio of 5.3. PLL 10' using the fractional divider performs phase comparisons at a rate of 10 times higher that for the prior art PLL.

Figure 11:
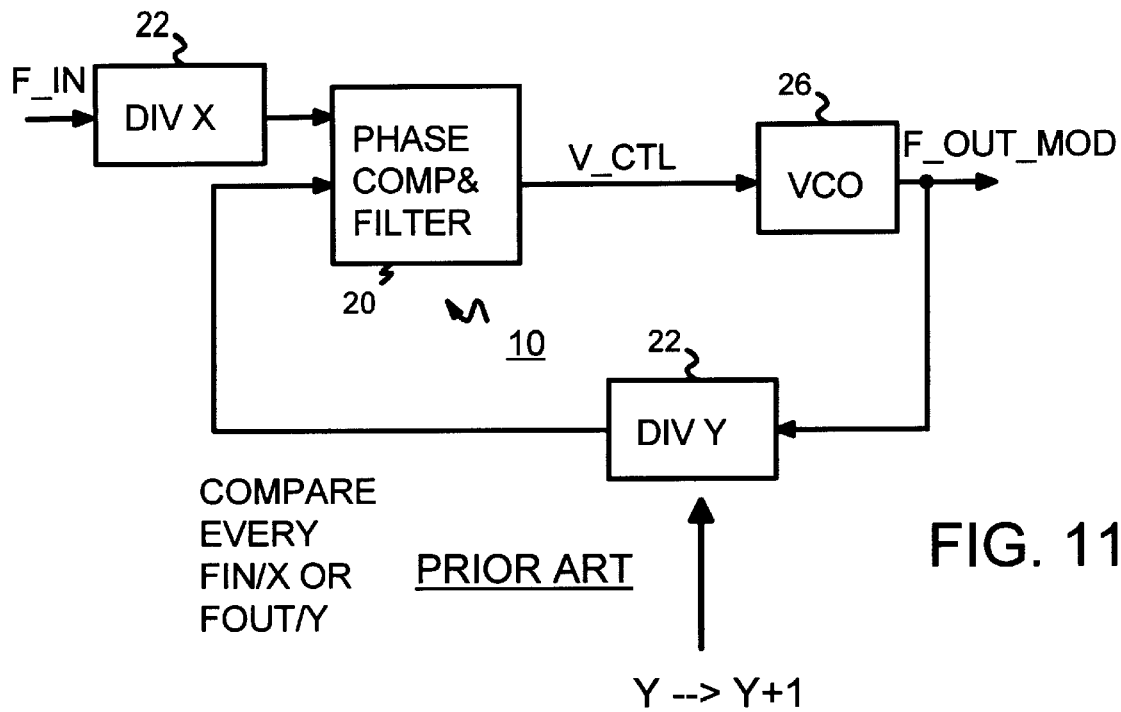
FIG. 11 shows a prior-art PLL that outputs a frequency-modulated clock.
Figure 12:
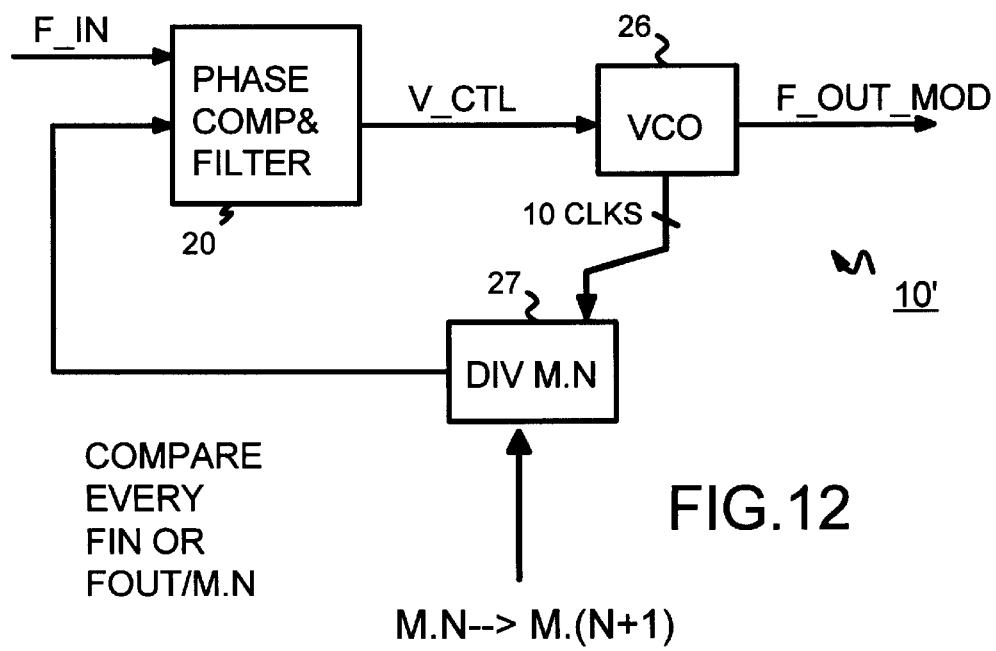
FIG. 12 shows a PLL that generates a modulated output using a fractional divider.

Modulated PLL—FIGS. 11, 12

FIG. 11 shows a prior-art PLL that outputs a frequency-modulated clock. electro-magnetic interference (EMI) can be reduced by modulating the frequency of a clock. The frequency is typically swept over a 5–10% range. PLL 10 outputs a modulated clock having a modulated frequency F_OUT_MOD. The divisor Y in feedback divider 22 is periodically changed from Y to Y+1 to alter the output frequency. The sweep rate, and rate of changing divisor Y is typically in the kHz range for output frequencies in the MHz range.

The relatively low rate of phase comparisons in PLL 10 causes the modulated output to slowly adjust to the changed divisor Y. Often output jitter is created as the divisor is changed.

FIG. 12 shows a PLL that generates a modulated output using a fractional divider. The output clock of PLL 10' is modulated by changing the fractional divisor in fractional divider 27. Only the fractional part N and not the integer part M is changed. Since M.N is a smaller number than X or Y, a smaller change in M.N is needed than for Y to produce the same change in frequency. Thus only the fractional part is changed for frequency modulation. The fractional part N is changed to N+1 to adjust the frequency.

Phase comparisons are preformed at a higher rate by PLL 10', since no input divider is needed and M.N is a relatively small number. Thus PLL 10' adjusts quickly to modulation changes. The waveform of the output clock is smooth during the transition from N to N+1. Jitter is reduced relative to PLL 10.

In the previous example, Y was 53 and is changed to Y+1 (54) during modulation. This is a change of a whole period of the output clock. When M.N is changed from 5.3 to 5.4, the change is only one-tenth of an output-clock period. This smaller modulation of the divisor is less disruptive to the frequency lock, and jitter and upset is reduced.

ADVANTAGES OF THE INVENTION

A relatively simple circuit is disclosed that precisely counts fractional values. Complex accumulators and digital adders are not needed. The delay-locked loop adjusts to momentary changes in the input frequency and can adapt to different input frequencies, such as is common for rate conversions in a multimedia system.

A small counter value is possible since the counter value or divisor does not have to be a whole number. Smaller divisors allow the clocks to remain at higher frequencies, so phase comparisons are preformed frequently. More phase comparisons helps the PLL track input and environmental changes more precisely.

When clock modulations or smooth clock frequency transitions are desired, as for EMI reduction and some CPU applications, the transitions in clock frequency are smoothed by the more frequent phase comparisons achievable. The frequency variation steps are smaller with the fractional counter than using an integer counter. Additional jitter is not introduced by the modulations.

ALTERNATE EMBODIMENTS

Several other embodiments are contemplated by the inventor. For example the polarities of signals can be changed, and counters triggered by falling rather than rising clock edges. A clock tripler rather than a doubler can be employed. A synchronous rather than an asynchronous reset can be used with a slight adjustment of the timings and waveforms. The DLL shown in FIG. 5 is not required because the fractional phases of the clock can be obtained directly from the VCO in the PLL.

The invention has been described as having ten taps in the delay line and delay-locked loop. This produces ten multi-phase clocks, each being a tenth of a clock period apart. However, different numbers of taps in the DLL can be substituted. The number of states in the state machine can be adjusted to match the number of multi-phase clocks. More states allows for finer and smoother adjustments in the rotational-phase clock. The fraction N can be expressed in binary or octal format, and the number of states can be a power of 2 or 8 rather than ten (decimal).

In applications where the disclosed fractional divider is used in the feedback path of a phase-locked-loop (PLL), such as shown in FIG. 12, the delay-locked-loop (DLL) inside divider 27 can be merged with the PLL. Multi-phase clocks to the phase-mux are supplied directly by the VCO 26. Normally, an oscillator is constructed as a loop of inverters. Delay line 86 of FIG. 5 can be converted into an oscillator by connecting the non-inverting (+) output of the last buffer 46 to the inverting (−) input of the first buffer 42. Likewise, the inverting (−) output of the last buffer 46 is connected to the non-inverting input of the first buffer 42. This forms a twisted loop of the five buffers, for a total loop delay of ten times the delay through one buffer. The period of oscillation is thus ten times the buffer delay.

This oscillator can be converted to a voltage-controlled oscillator (VCO) by making the buffer delay vary with an input control voltage. The control voltage can control a variable resistor on the output of each buffer, or control the Vcc power supply applied to each buffer. Then the delay varies with the control voltage.

The ten taps of the clock can be taken from the internal nodes of the VCO rather than use a separate delay line. Thus VCO 26 of FIG. 12 can output the ten multi-phase clocks directly to fractional divider 27. Fractional divider 27 then does not have to have a separate delay-locked loop. The clock-doubler block in divider 27 is also removed, since if M is less than 4, a post-scale divide-by-2 circuit (not shown in FIG. 12) is turned on to divide F_OUT_MOD such that M and N can be doubled without affecting the output frequency because the new F_OUT_MOD=F_IN*(2*M.N)/2=F_IN*M.N.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A fractional divider comprising:
   an input clock having an input period;
   a delay line, coupled to the input clock, having a plurality of output taps, successive output taps having successively larger phase shifts of the input clock;
   a phase mux, coupled to the plurality of output taps of the delay line, for outputting a selected clock in response to a control input;
   a rotational state machine having a plurality of states in a loop order, coupled to increment state to a next adjacent state in the loop order in response to the selected clock, the rotational state machine coupled to output a current state as the control input to the phase mux;
   wherein successive states in the loop order select successive output taps having successively larger phase shifts; and
   a counter, coupled to the selected clock, for pulsing an output clock after M pulses of the selected clock;
   wherein the rotational state machine increments to a next state, causing the phase mux to select an output tap having a larger phase shift, increasing a period of the selected clock for a first N periods of the selected clock;
   wherein the first N periods of the selected clock have an increased period while a remaining M−N periods have the input period of the input clock,
   whereby the output clock is pulsed after M.N periods of the input clock.

2. The fractional divider of claim 1 wherein M.N is a decimal number and wherein the plurality of output taps comprises ten taps, and wherein each successive output tap has a phase shift larger than a previous tap by one-tenth of the period of the input clock.

3. The fractional divider of claim 1 wherein the delay line is a delay-locked loop comprising:
   a loop filter for generating an adjustment voltage;

a phase comparator, receiving the input clock and a feedback clock from a last output tap of the delay line, the phase comparator including means for charging and discharging the loop filter in response to a phase difference between the input clock and the feedback clock; and delay adjust means, in the delay line, for increasing or decreasing the phase shift between successive output taps in response to the adjustment voltage, whereby the phase difference between output taps in the delay line is adjusted by phase comparison of the feedback clock with the input clock.

4. The fractional divider of claim 3 wherein the delay line comprises five buffers, each buffer with a true and a complement output, each buffer delaying an input by the phase shift.

5. The fractional divider of claim 3 further comprising:

reverse means, coupled to the rotational state machine, for reversing a direction of successive states in response to the selected clock, the rotational state machine decrementing states in a reverse loop order when M is less than N, wherein successive states in the reverse loop order select successive output taps having successively smaller phase shifts;

wherein the rotational state machine decrements to a next state, causing the phase mux to select an output tap having a smaller phase shift, decreasing a period of the selected clock for a first Q–N periods of the selected clock, wherein Q is a number of output taps coupled to the phase mux, whereby fractional clock periods are subtracted when M is less than N.

6. The fractional divider of claim 5 wherein the counter pulses the output clock after M+1 pulses of the selected clock when M is less than N.

7. The fractional divider of claim 6 further comprising:

compare means for determining when M is less than four;

a clock doubler for doubling a frequency of the input clock applied to the delay line when the compare means determines that M is less than four; and doubling means, coupled to the compare means, for doubling M and N applied to the rotational state machine and the counter when the compare means determines that M is less than four, whereby the input clock, M, and N are doubled when M is less than four.

8. A phase-locked loop comprising:

an input clock having an input frequency;

a phase comparator coupled to the input clock and to a feedback clock, the phase comparator comparing the input clock to the feedback clock and generating a control voltage in response to a difference between the input clock and the feedback clock;

a voltage-controlled oscillator (VCO), coupled to the control voltage from the phase comparator, for generating an output clock having an output frequency determined by the control voltage; and a fractional divider, receiving the output clock, for generating the feedback clock, the fractional divider generating the feedback clock with a frequency equal to the output frequency divided by M.N, where M is an integer part and N is a fractional part of a non-whole number, wherein the VCO includes means for generating a plurality of multi-phase clocks, the fractional divider further comprises:

a phase mux, receiving the plurality of multi-phase clocks from the VCO, the plurality of multi-phase clocks having equally-spaced phase differences within a period of the output clock, the phase mux for outputting a selected clock;

a state machine, coupled to control the phase mux, for sequencing through a plurality of N states, each new state controlling the phase mux to select a multi-phase clock having a larger phase delay;

a counter, coupled to the selected clock, for counting M pulses of the selected clock and then outputting an end of a period of the feedback clock, wherein a first N periods of the selected clock are longer in duration than a last M–N states of the selected clock, wherein the frequency of the feedback clock is M.N times the output frequency.

9. The phase-locked loop of claim 8 wherein the state machine comprises a loop of states, each state for selecting one of the multi-phase clocks, wherein adjacent states select multi-phase clocks having a phase difference of 1/P of an input period, where P is a number of states and also a number of multi-phase clocks generated.

10. The phase-locked loop of claim 9 wherein the phase comparator further comprises a loop filter capacitor being charged and discharged to the control voltage, wherein a plurality of clock phases available from the VCO are used.

11. The phase-locked loop of claim 8 wherein N is modulated but M remains constant over a sweep period, wherein the output frequency is modulated by modulation of the fractional part N without modulation of the integer part M.

12. The phase-locked loop of claim 11 wherein the sweep period is less than 100 kHz while the output frequency is several MHz.

13. The phase-locked loop of claim 8 wherein the phase comparator compares a phase of the input clock at a rate equal to the input frequency, wherein the control voltage being adjusted at the rate equal to the input frequency, whereby the input clock is not divided down in frequency and the control voltage is adjusted at the full input frequency.

14. The phase-locked loop of claim 8 further comprising:

reverse means, coupled to the state machine, for reversing a direction of successive states in response to the selected clock, the state machine decrementing states in a reverse loop order when M is less than N, wherein successive states in the reverse loop order select successive multi-phase clocks having successively smaller phase shifts;

wherein the state machine decrements to a next state, causing the phase mux to select a multi-phase clock having a smaller phase shift, decreasing a period of the selected clock for a first 10–N periods of the selected clock, whereby fractional clock periods are subtracted when M is less than N.

15. The phase-locked loop of claim 14 further comprising:

compare means for determining when M is less than four;

a clock doubler for doubling a frequency of the input clock when the compare means determines that M is less than four; and doubling means, coupled to the compare means, for doubling M and N applied to the state machine and the counter when the compare means determines that M is less than four, whereby the input clock, M, and N are doubled when M is less than four.

16. A method for dividing an input clock by a non-whole number divisor M.N, the divisor having an integer part M and a decimal part N, the method comprising the steps of:

generating a plurality of multi-phase clocks from the input clock, the multi-phase clocks having equally-spaced phase shifts over a period of the input clock;

selecting one of the multi-phase clocks as a selected clock;

rotating a state machine in a first direction to a next state, and selecting as the selected clock another of the multi-phase clocks having a next-larger phase shift to the selected clock in response to an edge of the selected clock;

wherein a period of the selected clock is larger than a period of the input clock by the phase shift when the state machine is rotated;

incrementing a counter in response to the edge of the selected clock;

continuing to rotate the state machine and select another multi-phase clock having larger phase shifts for a first N cycles of the selected clock;

halting rotation of the state machine and selecting a same multi-phase clock after N cycles of the selected clock;

wherein the period of the selected clock is equal to the period of the input clock when the state machine is not rotated;

continuing to increment the counter for M cycles of the selected clock; and generating an output from the counter after M cycles of the selected clock, the output having a frequency equal to the input clock's frequency divided by M.N, whereby M.N periods of the input clock before the output from the counter is generated.

17. The method of claim 16 further comprising when M is less than N the steps of:

rotating the state machine in an opposite direction to a next state, and selecting as the selected clock another of the multi-phase clocks having a next-smaller phase shift to the selected clock in response to an edge of the selected clock;

wherein a period of the selected clock is smaller than a period of the input clock by the phase shift when the state machine is rotated;

continuing to rotate the state machine and select another multi-phase clock having smaller phase shifts for a first 10–N cycles of the selected clock;

incrementing the counter for and extra cycle of the selected clock for a total of M+1 cycles;

generating the output from the counter after M+1 cycles of the selected clock, the output having a frequency equal to the input clock's frequency divided by M.N, whereby the state machine is rotated in the opposite direction for values of M less than N.

18. The method of claim 17 further comprising when M is less than four:

doubling the input clock;

doubling M and doubling N, whereby M, N, and the input clock are doubled for small values of M.

19. The method of claim 17 wherein a number of multi-phase clocks is equal to ten, and wherein the phase shift is one-tenth of the period of the input clock.

* * * * *